(12) United States Patent
Ito et al.

(10) Patent No.: US 7,644,337 B2
(45) Date of Patent: Jan. 5, 2010

(54) ERROR CORRECTION DEVICE, ENCODER, DECODER, METHOD, AND INFORMATION STORAGE DEVICE

(75) Inventors: Toshio Ito, Kawasaki (JP); Toshihiko Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 716 days.

(21) Appl. No.: 11/514,041

(22) Filed: Aug. 31, 2006

(65) Prior Publication Data

US 2007/0266300 A1    Nov. 15, 2007

(30) Foreign Application Priority Data

Apr. 28, 2006   (JP) .............................. 2006-124801

(51) Int. Cl.
*H03M 13/29*    (2006.01)

(52) U.S. Cl. ..................................... 714/755

(58) Field of Classification Search .................. 714/755
See application file for complete search history.

(56) References Cited

U.S. PATENT DOCUMENTS

| | | | |
|---|---|---|---|
| 5,206,864 | A | 4/1993 | McConnell |
| 6,374,382 | B1 * | 4/2002 | Solomon et al. ............ 714/755 |
| 6,622,277 | B1 * | 9/2003 | Ramanujam et al. ........ 714/755 |
| 6,625,775 | B1 * | 9/2003 | Kim ............................ 714/755 |
| 7,032,154 | B2 * | 4/2006 | Kidorf et al. ................ 714/755 |
| 7,146,553 | B2 * | 12/2006 | Jarchi et al. ................. 714/755 |
| 7,296,214 | B2 * | 11/2007 | Gupta ......................... 714/784 |
| 2004/0093549 | A1 | 5/2004 | Song et al. |

FOREIGN PATENT DOCUMENTS

WO    WO 97/00559    1/1997

OTHER PUBLICATIONS

Chaichanavong et al; "Tensor-Product Parity Codes: Combination with Constrained Codes and Application to Perpendicular Recording"; IEEE Trans. on Mag., Vo. 43, No. 2, Feb. 2006; pp. 214-219.

* cited by examiner

*Primary Examiner*—Stephen M Baker
(74) *Attorney, Agent, or Firm*—Greer, Burns & Crain, Ltd.

(57) ABSTRACT

An encoder divides the data in which sector data is adjacently connected to a first RS parity generated in Reed Solomon encoding into blocks to and subjects each of the blocks to cyclic Hamming encoding so as to generate Hamming parities. Subsequently, the data in which the Hamming parities are aligned in a row is subjected to Reed Solomon encoding so as to generate a second RS parity, and encoded data in which the first RS parity and the second RS parity are adjacently connected to the sector data is output. A decoder s divides the sector data and the first RS parity into n blocks and cyclic Hamming encoding, aligns the parities thereof, corrects errors in the parities by Reed Solomon decoding by the second RS parity, then corrects 1-bit errors in blocks by cyclic Hamming decoding, and further corrects errors of 2 or more bits by Reed Solomon decoding by the first RS parity.

17 Claims, 13 Drawing Sheets

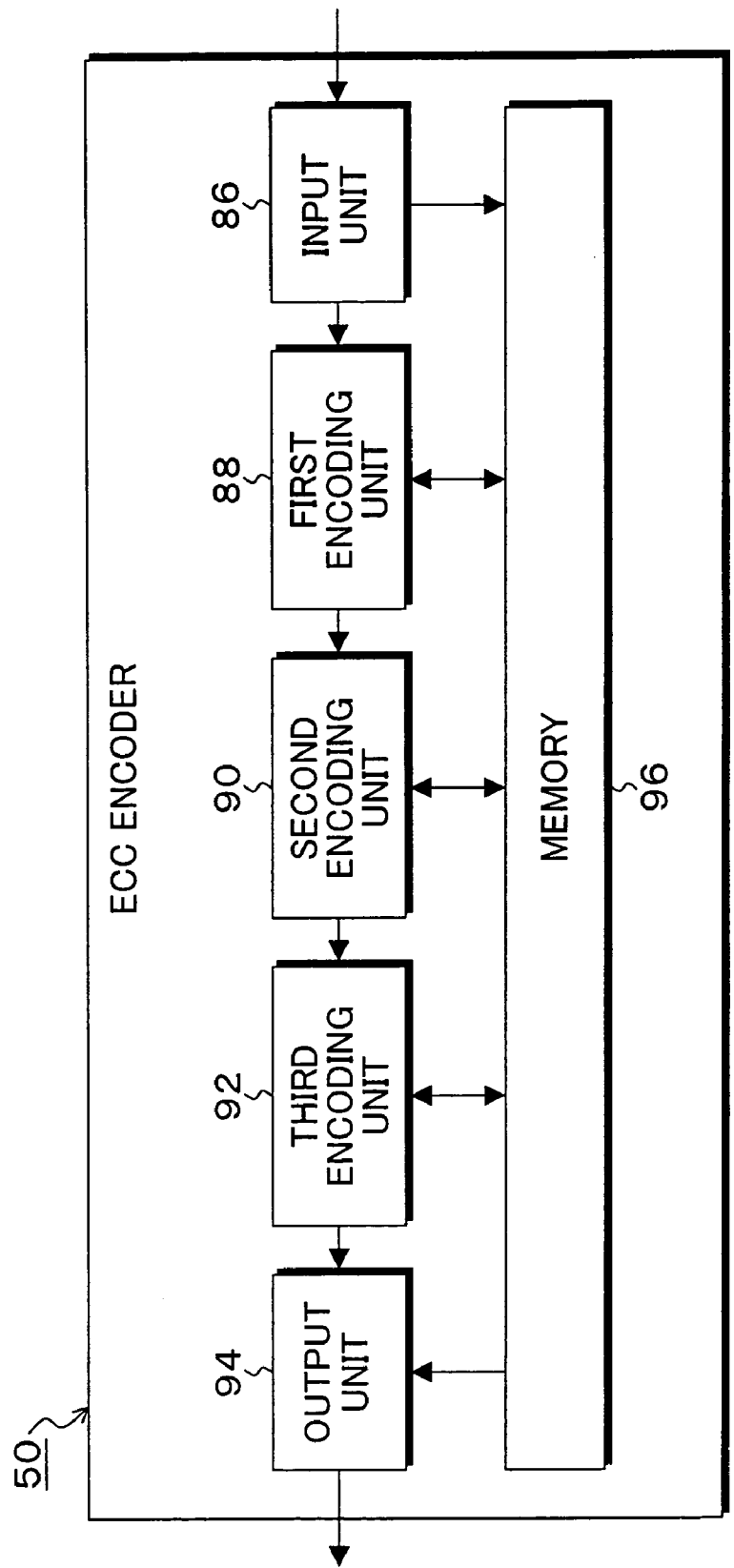

FIG. 4A ECC ENCODER INPUT

110 SECTOR DATA

FIG. 4B REED SOLOMON ENCODING

110 SECTOR DATA | 112 RS1-P

FIG. 4C DIVISION BY n 114-1 BL1 | 114-2 BL2 | 114-3 BL3 | ... | 114-n BLn

FIG. 4D CYCLIC HAMMING ENCODING 114-1 BL1, 116-1 P1 | 114-2 BL2, 116-2 P2 | ... | 114-n BLn, 116-n Pn

FIG. 4E REED SOLOMON ENCODING 116-1 P1 | 116-2 P2 | ... | 116-n Pn | 118 RS2-P

FIG. 4F ECC ENCODER OUTPUT

110 SECTOR DATA | 112 RS1-P | 118 RS2-P

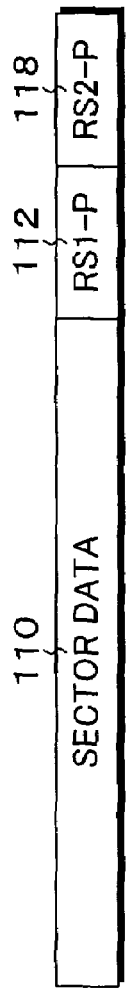
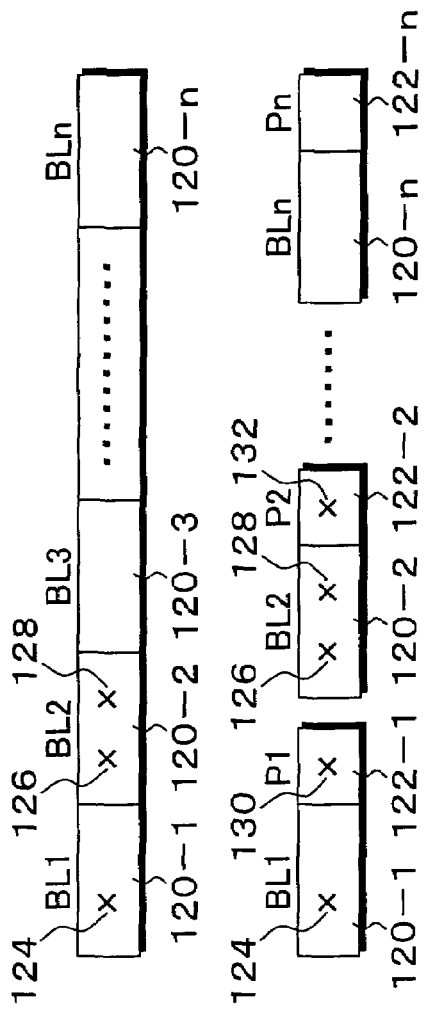
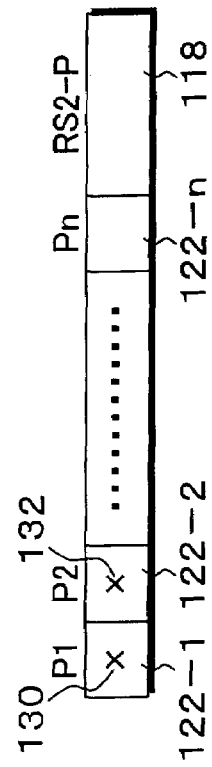
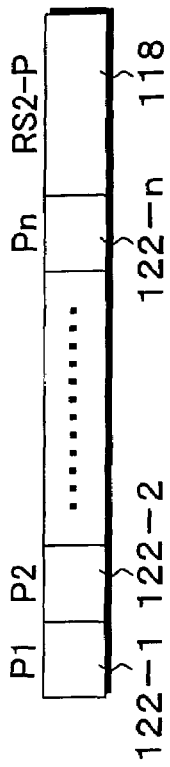
FIG. 8A ECC DECODER INPUT
FIG. 8B DIVISION BY n
FIG. 8C HAMMING ENCODING
FIG. 8D PARITY ALIGNMENT
FIG. 8E REED SOLOMON DECODING (PARITY ERROR CORRECTION)

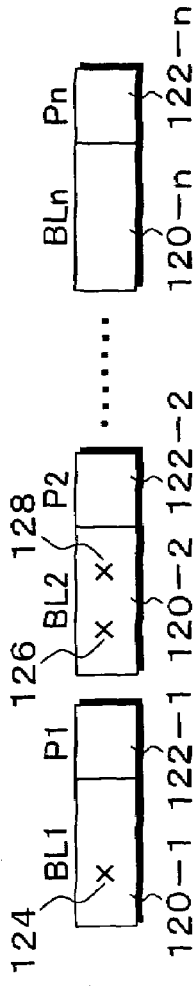
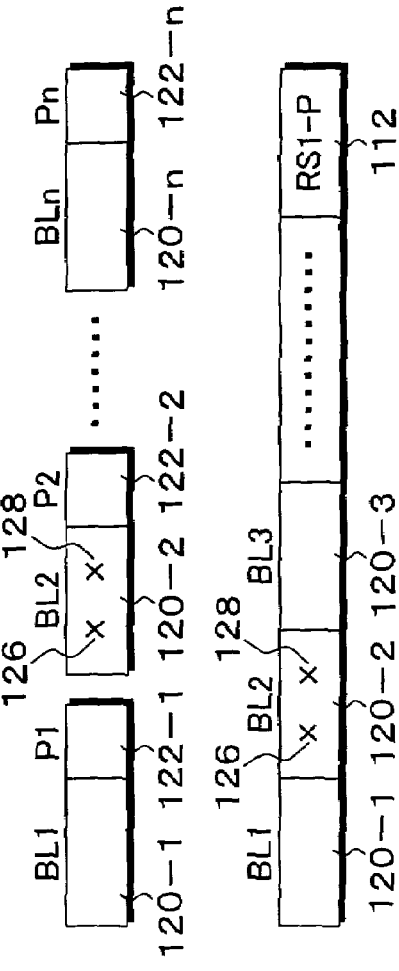
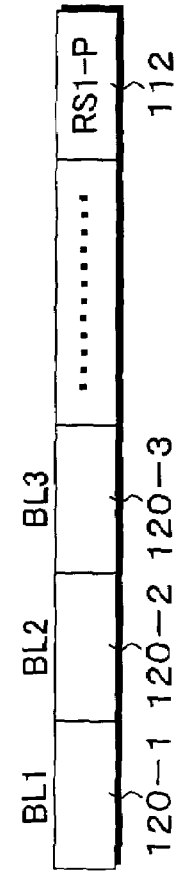
FIG. 8F CORRECTED PARITY RESTRUCTURING
FIG. 8G HAMMING DECODING (1-BIT CORRECTION)
FIG. 8H 1-BIT CORRECTION RESTRUCTURING
FIG. 8I REED SOLOMON DECODING (2-BIT CORRECTION)
FIG. 8J ECC DECODER OUTPUT

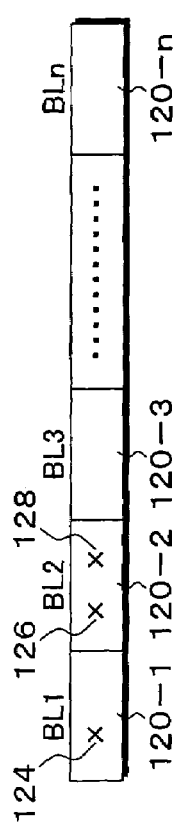
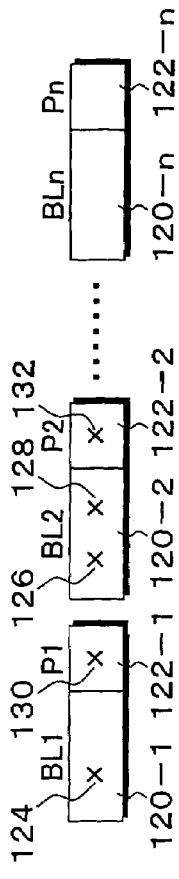
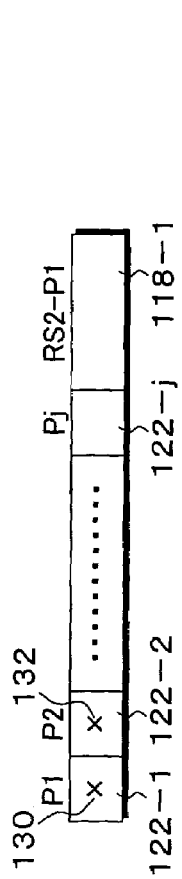
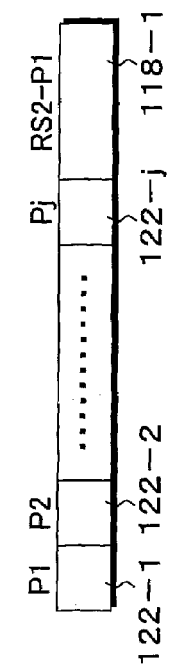
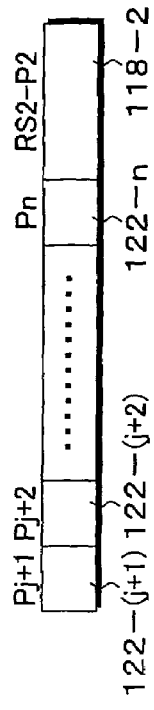
FIG. 9A ECC DECODER INPUT
FIG. 9B DIVISION BY n
FIG. 9C HAMMING ENCODING
FIG. 9D PARITY ALIGNMENT
FIG. 9E REED SOLOMON DECODING (PARITY ERROR CORRECTION)
FIG. 9F PARITY ALIGNMENT

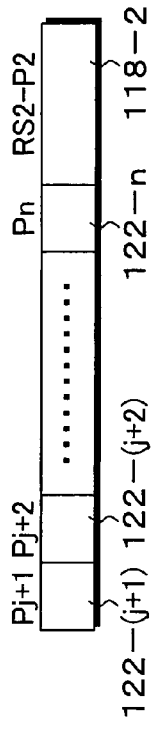
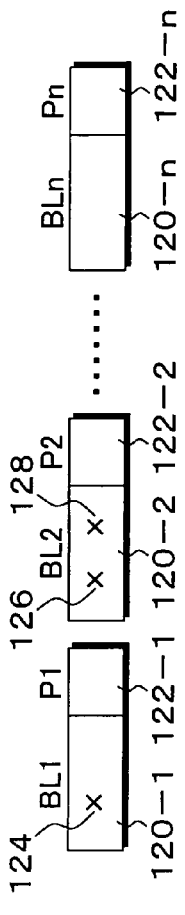
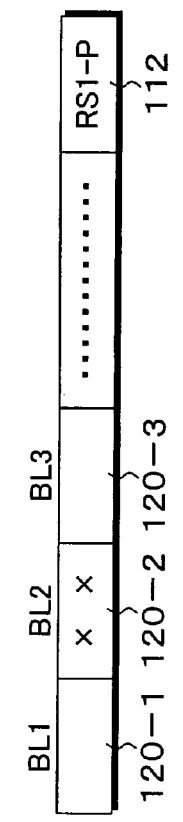
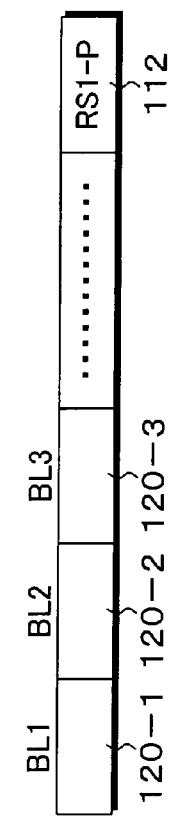
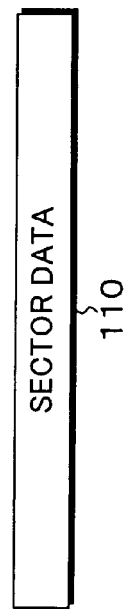
FIG. 9G
REED SOLOMON DECODING
(PARITY ERROR CORRECTION)
FIG. 9H
CORRECTED PARITY
RESTRUCTURING
FIG. 9I
HAMMING DECODING
(1-BIT CORRECTION)
FIG. 9J
1-BIT CORRECTION
RESTRUCTURING
FIG. 9K
REED SOLOMON DECODING
(2-BIT CORRECTION)
FIG. 9L
ECC DECODER OUTPUT

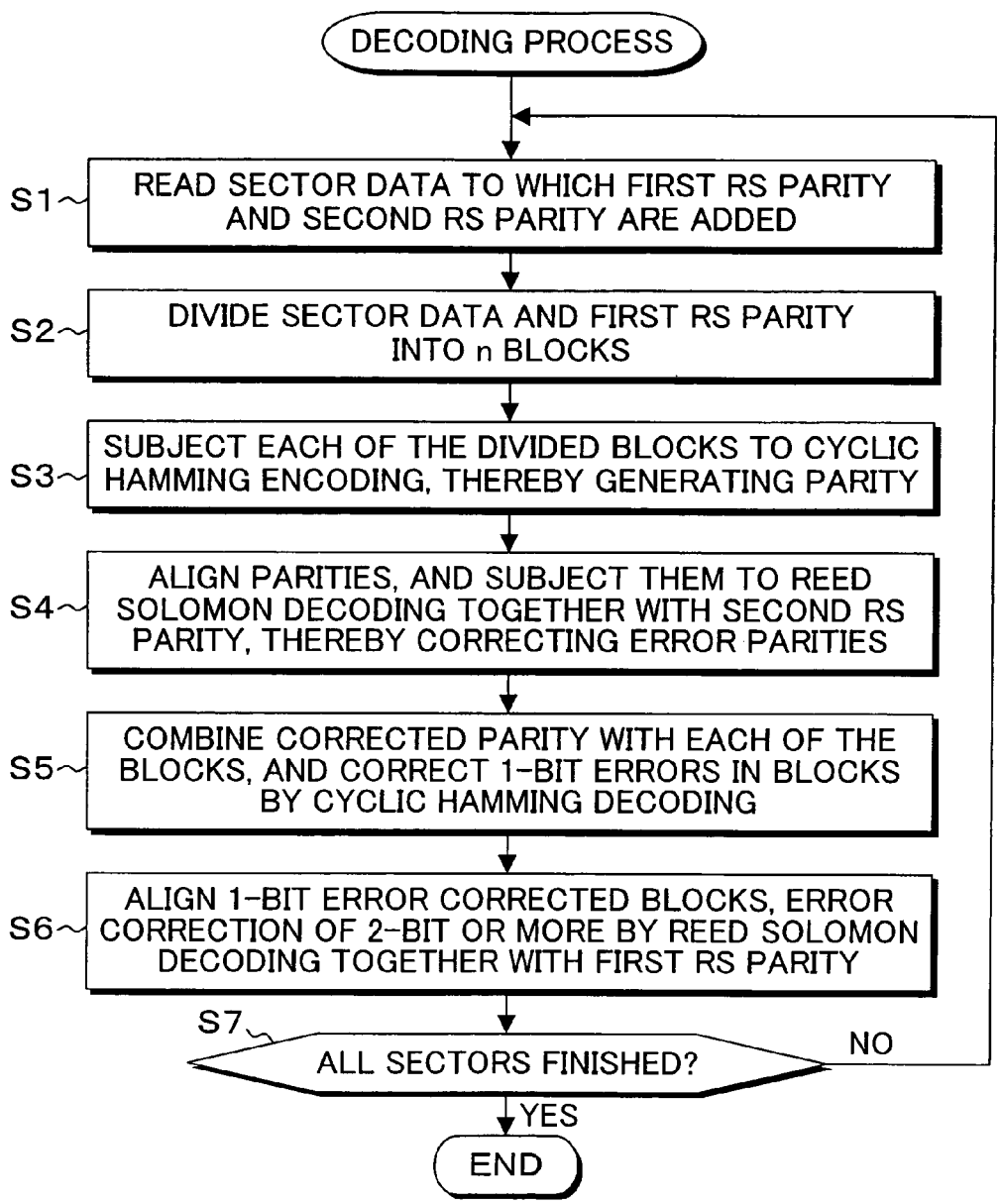

ERROR CORRECTION DEVICE, ENCODER, DECODER, METHOD, AND INFORMATION STORAGE DEVICE

This application is a priority based on prior application No. JP 2006-124801, filed Apr. 28, 2006, in Japan.

BACKGROUND OF THE INVENTION

1. Field of the Invention

The present invention relates to an error correction device, an encoder, a decoder, a method, and an information storage device for correcting errors in data which is to be transmitted in an m-bit-error-dominant sequence, and particularly relates to an error correction device, an encoder, a decoder, a method, and an information storage device for correcting errors in data which is to be transmitted in a 1-bit error-dominant recording/reproducing system such as a magnetic disk apparatus.

2. Description of the Related Arts

Conventionally, a Reed Solomon code (RS code) has been used as an ECC code, which is an error correcting code, in a magnetic disk apparatus or an optical disk apparatus. Under a circumstance in which long errors apt to occur like a conventional PRML channel, the Reed Solomon code can be assumed as an optimal error correcting code. Meanwhile, a low-density parity check code, i.e., LDPC code attracts attention as an error correcting technique of the next generation in magnetic disk apparatuses, and LDPC codes for magnetic disk apparatuses are actively studied. The LDPC code is remarkably excellent in the performance of correcting random errors. However, since the LDPC code involves a problem of, for example, error floor, error correction by an ECC code is required after decoding by the LDPC code. Herein, the error floor is referred to as a phenomenon in which, in an error correcting code, while the decoding error rate is rapidly improved in a low SNR (signal-to-noise power ratio) region along with decrease of noise power, the error rate is scarcely improved in a high SNR region even though the noise power is reduced.

However, 1-bit errors are predominant in the errors of data output in decoding by such conventional LDPC code, and 1 symbol is allocated to a 1-bit error in error correction by the Reed Solomon code; therefore, there is a problem that the maximum number of correctable 1-bit errors is limited, and efficient 1-bit error correction can not be performed.

SUMMARY OF THE INVENTION

According to the present invention to provide an error correction device, an encoder, a decoder, a method, and an information storage device which enable error correction suitable for a sequence having many 1-bit errors such as the LDPC code.

(Device)

The present invention provides an error correction device (ECC device). The present invention is an error correction device having an encoder and a decoder for correcting errors in data which is to be transmitted in a recording/reproducing system including a 1-bit-error-dominant recording medium, the error correction device characterized in that the encoder has an input unit that inputs unit length data to be recorded to the recording medium, a first encoding unit that subjects the unit length data to Reed Solomon encoding so as to generate a first RS parity, a second encoding unit that divides the data in which the first RS parity is adjacently connected to the unit length data into a predetermined number n of blocks and subjecting each of the blocks to Hamming encoding so as to generate Hamming parities, a third encoding unit that subjects data in which the Hamming parities are aligned in a row to Reed Solomon encoding so as to generate a second RS parity, and an output unit that outputs encoded data in which the first RS parity and the second RS parity are adjacently connected to the unit length data; and the decoder has an input unit that inputs the encoded data which is read from the recording medium and in which the first RS parity and the second RS parity are adjacently connected to the unit length data, a Hamming encoding unit that divides the data in which the first RS parity is adjacently connected to the unit length data into the predetermined number n of blocks and subjecting each of the blocks to Hamming encoding so as to generate Hamming parities, a first error correcting unit that subjects the data in which the Hamming parities are aligned in a row to Reed Solomon decoding together with the second RS parity so as to correct an error in the Hamming parities of the blocks, a second error correcting unit that subjects each of the blocks to cyclic Hamming decoding together with the error-corrected Hamming parity so as to correct a 1-bit error in the blocks, a third error correcting unit that subjects the data in which the 1-bit-error-corrected blocks are aligned to Reed Solomon decoding together with the first RS parity so as to correct an error in the blocks other than that of 1-bit, and an output unit that outputs the error-corrected unit length data.

Herein, if the data in which the Hamming parities are aligned in a row exceeds a maximum code length of a Reed Solomon code, the third encoding unit of the encoder divides the data into a plurality of pieces of data and subjects each of the divided pieces of the data to Reed Solomon encoding so as to generate a plurality of second RS parities; and the output unit of the encoder outputs encoded data in which the first RS parity and the plurality of second RS parities are adjacently connected to the unit length data.

If the plurality of second RS parities are adjacently connected to the unit data, the first error correcting unit of the decoder divides the data, in which the Hamming parities are aligned in a row, corresponding to the plurality of second RS parities and subjects each of the divided pieces of data to Reed Solomon decoding together with the corresponding second RS parity so as to correct an error in the Hamming parities of the blocks.

The present invention provides an encoder. The present invention is an encoder for performing encoding for error correction of data which is to be transmitted in a recording/reproducing system including a 1-bit-error-dominant recording medium, the encoder characterized by having an input unit that inputs unit length data to be recorded to the recording medium, a first encoding unit that subjects the unit length data to Reed Solomon encoding so as to generate a first RS parity, a second encoding unit that divides the data in which the first RS parity is adjacently connected to the unit length data into a predetermined number n of blocks and subjecting each of the blocks to Hamming encoding so as to generate Hamming parities, a third encoding unit that subjects data in which the Hamming parities are aligned in a row to Reed Solomon encoding so as to generate a second RS parity, and an output unit that outputs encoded data in which the first RS parity and the second RS parity are adjacently connected to the unit length data.

The present invention provides a decoder. The present invention is a decoder for decoding encoded data encoded for error correction of data which is to be transmitted in a recording/reproducing system including a 1-bit-error-dominant recording medium, the decoder characterized by having an input unit that inputs the encoded data which is read from the recording medium and in which the first RS parity and the second RS parity are adjacently connected to the unit length data, a Hamming encoding unit that divides the data in which the first RS parity is adjacently connected to the unit length data into the predetermined number n of blocks and subjecting each of the blocks to Hamming encoding so as to generate Hamming parities, a first error correcting unit that subjects the data in which the Hamming parities are aligned in a row to Reed Solomon decoding together with the second RS parity so as to correct an error in the Hamming parities of the blocks, a second error correcting unit that subjects each of the blocks to cyclic Hamming decoding together with the error-corrected Hamming parity so as to correct a 1-bit error in the blocks, a third error correcting unit that subjects the data in which the 1-bit-error-corrected blocks are aligned to Reed Solomon decoding together with the first RS parity so as to correct an error in the blocks other than that of 1-bit, and an output unit that outputs the error-corrected unit length data.

The present invention provides an error correction device having an encoder and a decoder for correcting errors in data which is to be transmitted in an m-bit-error-dominant sequence. Such error correction device of the present invention is characterized in that the encoder has an input unit that inputs unit length data, a first encoding unit that subjects the unit length data to Reed Solomon encoding so as to generate a first RS parity, a second encoding unit that divides the data in which the first RS parity is adjacently connected to the unit length data into a predetermined number n of blocks and generating an m-bit correcting parity for each of the blocks by an m-bit error correcting code, a third encoding unit that subjects the data in which the m-bit correcting parities are aligned in a row to Reed Solomon encoding so as to generate a second RS parity, and an output unit that outputs encoded data in which the first RS parity and the second RS parity are adjacently connected to the unit length data; and the decoder has an input unit that inputs the encoded data in which the first RS parity and the second RS parity are adjacently connected to the unit length data, an m-bit correcting encoding unit that divides the data in which the first RS parity is adjacently connected to the unit length data into the predetermined number n of blocks and generating an m-bit correcting parity for each of the blocks by an m-bit error correcting code, a first error correcting unit that subjects the data in which the m-bit correcting parities are aligned in a row to Reed Solomon decoding together with the second RS parity so as to correct an error in the m-bit correcting parities of the blocks, a second error correcting unit that subjects each of the blocks to decoding together with the error-corrected m-bit correcting parity so as to correct an m-bit error in each of the blocks, a third error correcting unit that subjects the data in which the m-bit-error-corrected blocks are aligned to Reed Solomon decoding together with the first RS parity so as to correct an error in the blocks other than that of m-bit, and an output unit that outputs the error-corrected unit length data.

(Method)

The present invention provides an error correction method. The present invention is an error correction method having an encoding step and a decoding step for correcting errors in data which is to be transmitted in a recording/reproducing system including a 1-bit-error-dominant recording medium, the error correction method characterized in that the encoding step includes an input step of inputting unit length data to be recorded to the recording medium, a first encoding step of subjecting the unit length data to Reed Solomon encoding so as to generate a first RS parity, a second encoding step of dividing the data in which the first RS parity is adjacently connected to the unit length data into a predetermined number n of blocks and subjecting each of the blocks to Hamming encoding so as to generate Hamming parities, a third encoding step of subjecting the data in which the Hamming parities are aligned in a row to Reed Solomon encoding so as to generate a second RS parity, and an output step of outputting encoded data in which the first RS parity and the second RS parity are adjacently connected to the unit length data; and the decoding step includes an input step of inputting the encoded data which is read from the recording medium and in which the first RS parity and the second RS parity are adjacently connected to the unit length data, a Hamming encoding step of dividing the data in which the first RS parity is adjacently connected to the unit length data into the predetermined number n of blocks and subjecting each of the blocks to Hamming encoding so as to generate Hamming parities, a first error correcting step of subjecting the data in which the Hamming parities are aligned in a row to Reed Solomon decoding together with the second RS parity so as to correct an error in the Hamming parities of the blocks, a second error correcting step of subjecting each of the blocks to cyclic Hamming decoding together with the error-corrected Hamming parity so as to correct a 1-bit error in the blocks, a third error correcting step of subjecting the data in which the 1-bit-error-corrected blocks are aligned to Reed Solomon decoding together with the first RS parity so as to correct an error in the blocks other than that of 1-bit, and an output step of outputting the error-corrected unit length data.

The present invention is an error correction method including an encoding step and a decoding step for correcting errors in data which is to be transmitted in an m-bit-error-dominant sequence, the error correction method characterized in that the encoding step includes an input step of inputting unit length data, a first encoding step of subjecting the unit length data to Reed Solomon encoding so as to generate a first RS parity, a second encoding step of dividing the data in which the first RS parity is adjacently connected to the unit length data into a predetermined number n of blocks and generating an m-bit correcting parity for each of the blocks by an m-bit error correcting code, a third encoding step of subjecting the data in which the m-bit correcting parities are aligned in a row to Reed Solomon encoding so as to generate a second RS parity, and an output step of outputting encoded data in which the first RS parity and the second RS parity are adjacently connected to the unit length data; and the decoding step includes an input step of inputting the encoded data in which the first RS parity and the second RS parity are adjacently connected to the unit length data, an m-bit correcting encoding step of dividing the data in which the first RS parity is adjacently connected to the unit length data into the predetermined number n of blocks and generating an m-bit correcting parity for each of the blocks by an m-bit error correcting code, a first error correcting step of subjecting the data in which the m-bit correcting parities are aligned in a row to Reed Solomon decoding together with the second RS parity so as to correct an error in the m-bit correcting parities of the blocks, a second error correcting step of subjecting each of the blocks to decoding together with the error-corrected m-bit correcting parity so as to correct an m-bit error in the blocks, a third error correcting step of subjecting the data in which the m-bit-error-corrected blocks are aligned to Reed Solomon decoding together with the first RS parity so as to correct an error in the blocks other than that of m-bit, and an output step of outputting the error-corrected unit length data.

(Information Storage Device)

The present invention provides an information storage device. The present invention is an information storage device having a recording/reproducing system including a 1-bit-error-dominant recording medium and an error correction device having an encoder and a decoder for correcting errors in data which is to be transmitted in the recording/reproducing system, the information storage device characterized in that the encoder has an input unit that inputs unit length data to be recorded to the recording medium, a first encoding unit that subjects the unit length data to Reed Solomon encoding so as to generate a first RS parity, a second encoding unit that divides the data in which the first RS parity is adjacently connected to the unit length data into a predetermined number n of blocks and subjecting each of the blocks to cyclic Hamming encoding so as to generate Hamming parities, a third encoding unit that subjects the data in which Hamming parities are aligned in a row to Reed Solomon encoding so as to generate a second RS parity, and an output unit that outputs encoded data in which the first RS parity and the second RS parity are adjacently connected to the unit length data; and the decoder has an input unit that inputs the encoded data which is read from the recording medium and in which the first RS parity and the second RS parity are adjacently connected to the unit length data, a Hamming encoding unit that divides the data in which the first RS parity is adjacently connected to the unit length data into the predetermined number n of blocks and subjecting each of the blocks to cyclic Hamming encoding so as to generate Hamming parities, a first error correcting unit that subjects the data in which the Hamming parities are aligned in a row to Reed Solomon decoding together with the second RS parity so as to correct an error in the Hamming parities of the blocks, a second error correcting unit that subjects each of the blocks to cyclic Hamming decoding together with the error-corrected Hamming parity so as to correct a 1-bit error in the blocks, a third error correcting unit that subjects the data in which the 1-bit-error-corrected blocks are aligned to Reed Solomon decoding together with the first RS parity so as to correct an error in the blocks other than that of 1-bit, and an output unit that outputs the error-corrected unit length data.

According to the present invention, as error correction for a sequence of a recording/reproducing system such as an LDPC code having many 1-bit errors, by virtue of encoding and decoding by means of a connected code in which both a Reed Solomon code for correcting errors other than those of 1 bit and a Hamming code for correcting 1-bit errors are combined, if it is same as the parity length of the Reed Solomon code, the number of corrected 1-bit errors can be increased by the Reed Solomon code, and efficient error correction can be performed for 1-bit errors which frequently occur in decode output by means of a LDPC code.

Moreover, errors of two or more bits scarcely occur in decode output by means of the LDPC code, and therefore not much enhancement of the correction ability by the Reed Solomon code is required. As a result, the parity length by means of the connected code can be reduced to perform efficient error correction. The above and other objects, features, and advantages of the present invention will become more apparent from the following detailed description with reference to the drawings.

BRIEF DESCRIPTION OF THE DRAWINGS

FIG. 3 is a block diagram of a functional configuration of the ECC encoder of FIGS. 2A and 2B;

FIGS. 4A to 4F are explanatory diagrams of an encoding process by the ECC encoder of FIG. 3;

FIGS. 8A to 8J are explanatory diagrams of a decoding process by the ECC decoder of FIG. 7;

FIGS. 9A to 9I are explanatory diagrams of a decoding process performed for the encoded data involving the interleaving of FIG. 5;

FIGS. 9J to 9L are explanatory diagrams of the decoding process subsequent to FIGS. 9A to 9I; and FIGS. 10A and 10B are flow charts of the decoding process by the ECC decoder of FIG. 7.

DETAILED DESCRIPTION OF THE PREFERRED EMBODIMENTS

Figure 1:
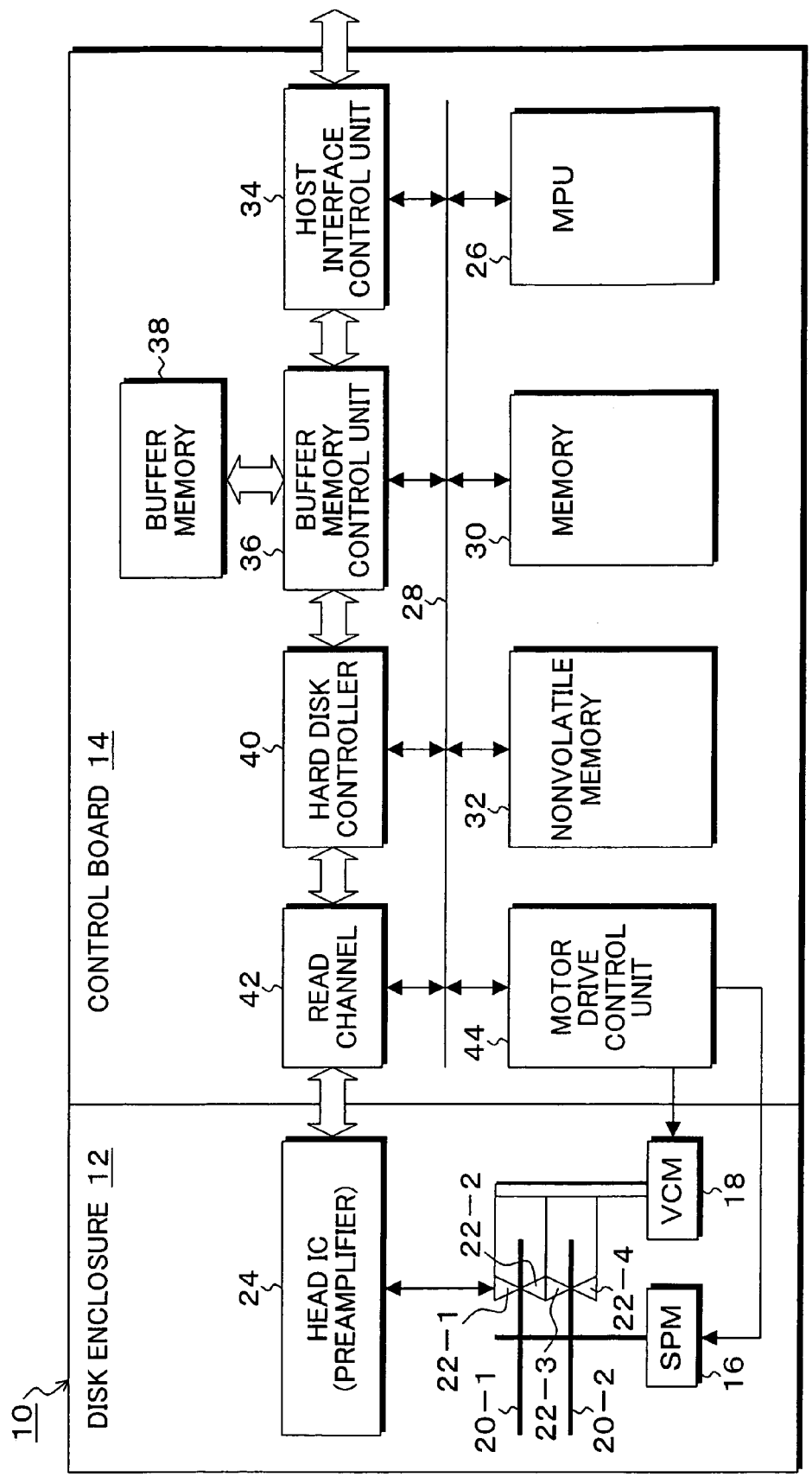
FIG. 1 is an explanatory diagram showing an embodiment of a magnetic disk apparatus to which the present invention is applied.

FIG. 1 is a block diagram of a magnetic disk apparatus to which the present invention is applied. In FIG. 1, the magnetic disk apparatus 10 known as a hard disk drive (HDD) comprises a disk enclosure 12 and a control board 14. A spindle motor 16 is provided in the disk enclosure 12, and magnetic disks (storage media) 20-1 and 20-2 are attached to a rotation shaft of the spindle motor 16 which is rotated at constant revolutions such as 4200 rpm. A voice coil motor 18 is provided in the disk enclosure 12. The voice coil motor 18 has heads 22-1 to 22-4 mounted at arm leading ends of a head actuator and performs positioning of the heads relative to the recording faces of the magnetic disks 20-1 and 20-2. Write head elements and read head elements are integrally mounted on the heads 22-1 to 22-2. The magnetic recording method used by the heads 22-1 to 22-4 with respect to the magnetic disks 20-1 and 20-2 may be either a longitudinal recording method or a perpendicular recording method. The heads 22-1 and 22-2 are connected to a head IC 24 (also referred to as "preamplifier") via signal lines. The head IC 24 selects one of the heads in accordance with a head select signal based on a write command or a read command from the host serving as an upper-level device, thereby performing a write or a read. An MPU 26 is provided in the control board 14, and a memory 30 storing a control program using a RAM and control data and a non-volatile memory 32 storing a control program using FROM or the like are provided for the bus 28 of the MPU 26. In addition, on the bus 28 of the MPU 26, a host interface control unit 34, a buffer memory control unit 36 for controlling a buffer memory 38, a hard disk controller 40 serving as a formatter, a read channel 42 serving as a write modulating unit and a read modulating unit, and a motor drive control unit 44 for controlling the voice coil motor 18 and the spindle motor 16 are provided. The magnetic disk apparatus 10 performs write processing and read processing based on commands from the host. Normal operations in the magnetic disk apparatus will be described below. When the host interface control unit 34 receives a write command and write data from the host, the write command is decoded by the MPU 26, and the received write data is stored in the buffer memory 38 in accordance with needs. It is then converted into a predetermined data format by the hard disk controller 40, and an ECC code is added thereto through an ECC encoding process. After performing LDPC code conversion and record compensation in the write modulating system in the read channel 42, it is written, for example, from the write head of the selected head 22-1 to the magnetic disk 20-1 via the head IC 24 from a write amplifier. At this point, a head positioning signal is given from the MPU 26 to the motor drive control unit 44, the head is caused by the voice coil motor 18 to seek a target track specified by the command, and then, it is put on the track so as to perform tracking control. Meanwhile, when the host interface control unit 34 receives a read command from the host, the read command is decoded by the MPU 26, and a read signal read from the read head which is selected in head selection of the head IC 24 is amplified by an amplifier. Then, it is input to the read modulation system of the read channel 42, the read data is demodulated by channel decoding and LDPC decoding, and errors are detected and corrected by performing ECC decoding processing in the hard disk controller 40. Then, it is buffered to the buffer memory 38, and the read data is transferred from the host interface control unit 34 to the host.

Figure 2A:
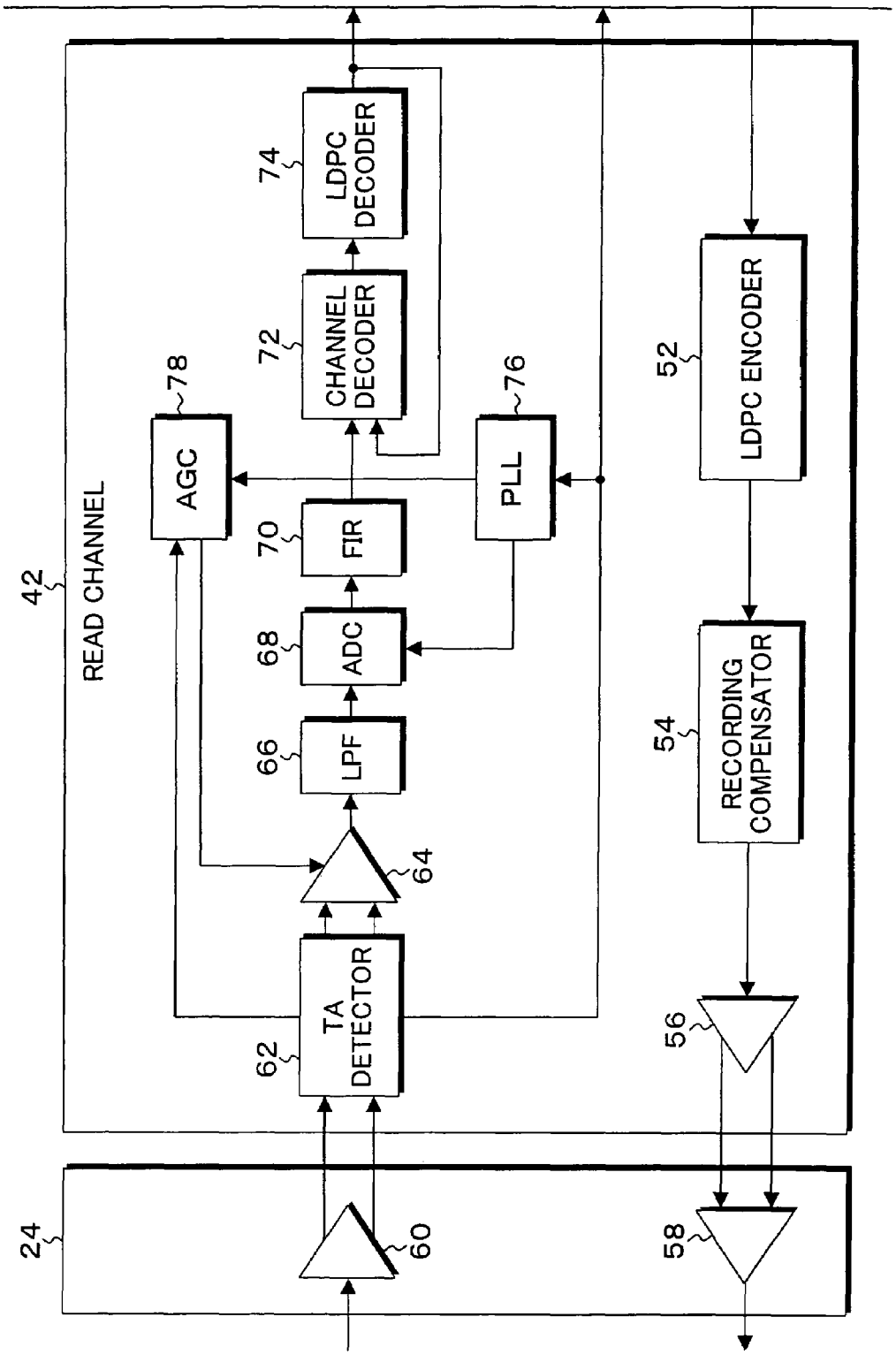
FIGS. 2A and 2B are block diagrams showing a configuration of recording/reproducing systems in the hard disk controller, the read channel, and the head IC of FIG. 1.
Figure 2B:
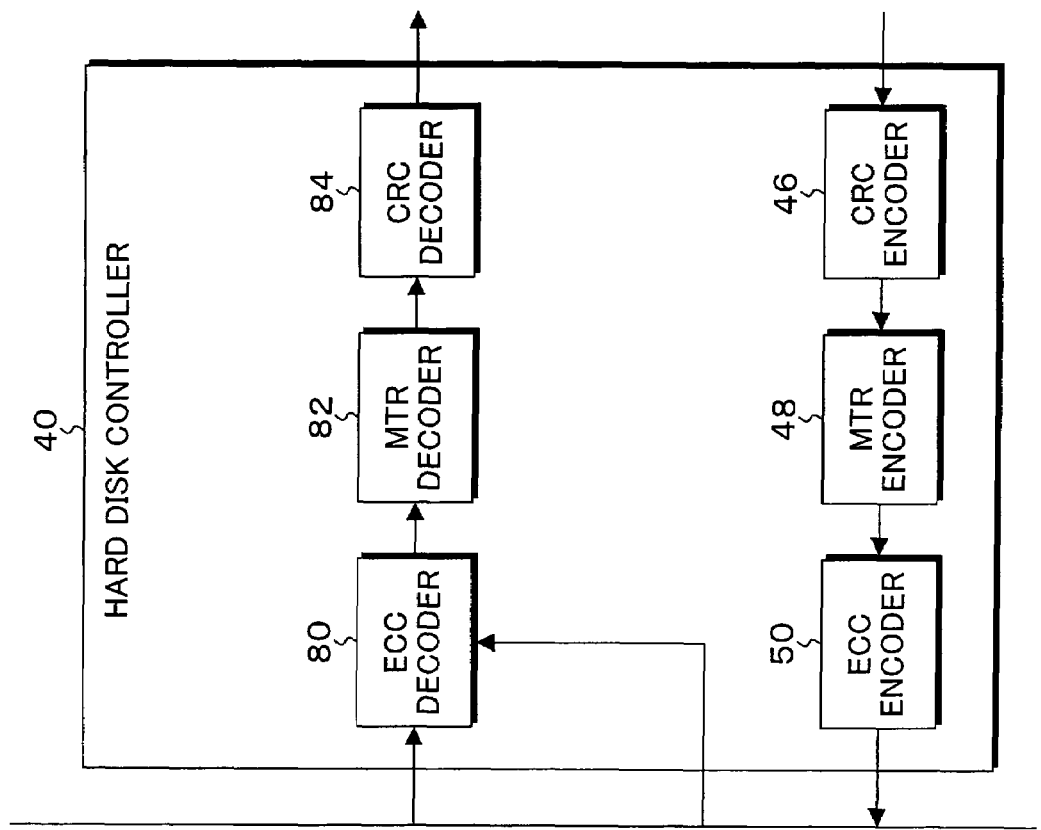

FIGS. 2A and 2B are block diagrams showing a configuration of the recording/reproducing systems in the hard disk controller, the read channel, and the head IC of FIG. 1. In FIGS. 2A and 2B, the recording/reproducing systems of the magnetic disk apparatus comprise the hard disk controller 40, the read channel 42, and the head IC 24. The recording system comprises a CRC encoder 46, an MTR encoder 48, and an ECC encoder 50 to which the present embodiment is applied of the hard disk controller 40; an LDPC encoder 52, a recording compensator 54, and a driver 56 provided in the read channel 42; and a driver 58 of the head IC 24. Write data is separated into sector data which is unit length data through format processing in the hard disk controller 40, and the sector data is subjected to CRC encoding in the CRC encoder 46 and then converted into a data sequence which satisfies restriction conditions through MTR encoding by the MTR encoder 48. Subsequently, a parity is added thereto through an encoding process by the ECC encoder 50 serving as an embodiment of the present invention, and it is transmitted to the read channel 42. In the read channel 42, after LDPC encoding is performed by the LDPC encoder 52, a compensation process in which switching intervals are slightly expanded at the adjacent portions of switched magnetization by the recording compensator 54. Then, it is output from the driver 56 to the driver 58 of the head IC 24, and a write current is caused to flow from the driver 58 to the recording element of the head, thereby recording it onto the magnetic disc. On the other hand, the reproducing system comprises an amplifier 60 of the head IC 24; a TA (thermal asperity) detector 62, a variable gain amplifier 64, a low-pass filter 66, an AD converter 68, an FIR filter 70, a channel decoder 72, and an LDPC decoder 74 provided in the read channel 42; and an ECC decoder 80 serving as an embodiment of the present invention, an MTR decoder 82, and a CRC decoder 84 provided in the hard disk controller 40. Furthermore, a PLL circuit 76 and an automatic gain controller 78 are provided in the reproducing system of the read channel 42. The analog read voltage signal read from the magnetic disk by the reading element is amplified in the amplifier 60 of the head IC 24 first, and then, transmitted to the read channel 42. In the read channel 42, after a detection process of thermal asperity is performed by the TA detector 62, it is converted into a digital signal via the variable gain amplifier 64, the low-pass filter 66, and the AD converter 68. Subsequently, after waveform equalization is performed by the FIR filter 70, iterative decoding is performed by the channel decoder 72 and the LDPC decoder 74. The PLL circuit 76 controls the timing for sampling the signal by the AD converter 68. The automatic gain controller 78 controls the gain such that the output level of the variable gain amplifier 64 attains a constant level. The digital signal from the read channel 42 is transmitted to the hard disk controller 40, and error correction by the ECC decoder 80 serving as an embodiment of the present invention is performed. Then, after MTR decoding by the MTR decoder 82 and CRC decoding by the CRC decoder 84, it is output as reproduced data.

FIG. 3 is a block diagram of a functional configuration showing the embodiment of the ECC encoder of FIGS. 2A and 2B. In FIG. 3, the ECC encoder 50 comprises an input unit 86, a first encoding unit 88, a second encoding unit 90, a third encoding unit 92, and an output unit 94. The procedure of the encoding process by the ECC encoder 50 includes the following three processes.

(1) Encoding by Reed Solomon code;

(2) Encoding by cyclic Hamming code; and (3) Encoding by Reed Solomon code with respect to parity obtained by the cyclic Hamming encoding;

More specifically, the input unit 86 inputs sector data as unit length data to be recorded to the magnetic disk and saves it in the memory 96. The first encoding unit 88 subjects the sector data to Reed Solomon encoding, thereby generating a first RS parity. The second encoding unit 90 divides the data in which the sector data is continuous with the first RS parity into blocks of a predetermined number n and subjects each of the blocks to cyclic Hamming encoding, thereby generating Hamming parities. The third encoding unit 92 generates a second RS parity by subjecting the data in which the hamming parities generated by the second encoding unit 90 are aligned in a row to Reed Solomon encoding. The output unit 94 outputs the encoded data (code word) in which the first RS parity generated by the first encoding unit 88 and the second RS parity generated by the third encoding unit 92 are continuous to the sector data saved in the memory 96.

FIGS. 4A to 4F are explanatory diagrams showing details of the encoding process performed by the ECC encoder 50 of FIG. 3. FIG. 4A shows sector data 110 corresponding to one sector which is to be input to the ECC encoder 50, and it has a data length of, for example, 4100 bits. The sector data 110 of FIG. 4A is subjected to Reed Solomon encoding as shown in FIG. 4B by the first encoding unit 88, and a first RS parity 112 represented by "RS1-P" generated by this encoding is disposed in front of the sector data 110. Herein, if the symbol length of the Reed Solomon code is q1 bits and the number of corrected symbols is t1, the first RS parity 112 has a parity bit length=(2×q1×t1) bits. For example, in the present embodiment, the symbol length q1 of the Reed Solomon code according to the first encoding unit 88 is q1=10 bits and the number of corrected symbols t1 is t1=4 symbols; and, in this case, the bit length of the first RS parity 112 is $$(2 \times q1 \times t1) = 80 \text{ bits}.$$

The Reed Solomon encoding performed on the sector data 110 by the first encoding unit 88 can be expressed as "Reed Solomon encoding of $GF(2^{10})$, t=4". Next, the data in which the first RS parity 112 is disposed at the top of the sector data 110 of FIG. 4B is divided into n pieces of blocks 114-1 to 114-n by the second encoding unit 90. Then, cyclic Hamming encoding is performed for each of the divided data 114-1 to 114-n, and Hamming parities 116-1 to 116-n represented by symbols "p1 to pn" obtained by the cyclic Hamming encoding are disposed at the top side of the blocks 114-1 to 114-n. The cyclic Hamming encoding for the blocks 114-1 to 114-n of FIGS. 4C and 4D divided by n can be expressed as "cyclic Hamming encoding of (code length n', information length k')". Herein, regarding the cyclic Hamming code, if a generated polynomial expression is an m-degree primitive polynomial expression over GF(2), there is a correlation between the maximum code length n' and the maximum information length k' that $$n' = 2^m - 1$$

$$k' = 2^m - 1 - m.$$

In the present embodiment, if the degree m=7, n'=127, k'=120, and this can be expressed as "(n',k')=(127,120) cyclic Hamming encoding". The block length of each of the n pieces of blocks 114-1 to 114-n has to be k' or less. Therefore, cyclic Hamming encoding is performed, for example, when the block length is 60 bits. In this case, the division number is n=70. Then, in the third encoding unit 92, as shown in FIG. 4E, the Hamming parities 116-1 to 116-n obtained in the cyclic Hamming encoding of FIG. 4D are aligned in a row, the aligned Hamming parities 116-1 to 116-n are subjected to Reed Solomon encoding to generate a second RS parity 118, and it is disposed at the top. In the Reed Solomon encoding for the Hamming parity row, if the symbol length of the Reed Solomon code is q2 bits and the number of corrected symbols is t2, the parity bit length of the second RS parity 118 obtained by the Reed Solomon encoding is $$\text{parity bit length} = (2 \times q2 \times t2) \text{ bits}.$$

In the Reed Solomon encoding for the Hamming parity row in the present embodiment, for example, the symbol length q2=7 bits and the number t2 of corrected symbols=28 symbols, and the parity bit length in this case is $$(2 \times q2 \times t2) = 392 \text{ bits}.$$

Figure 5:
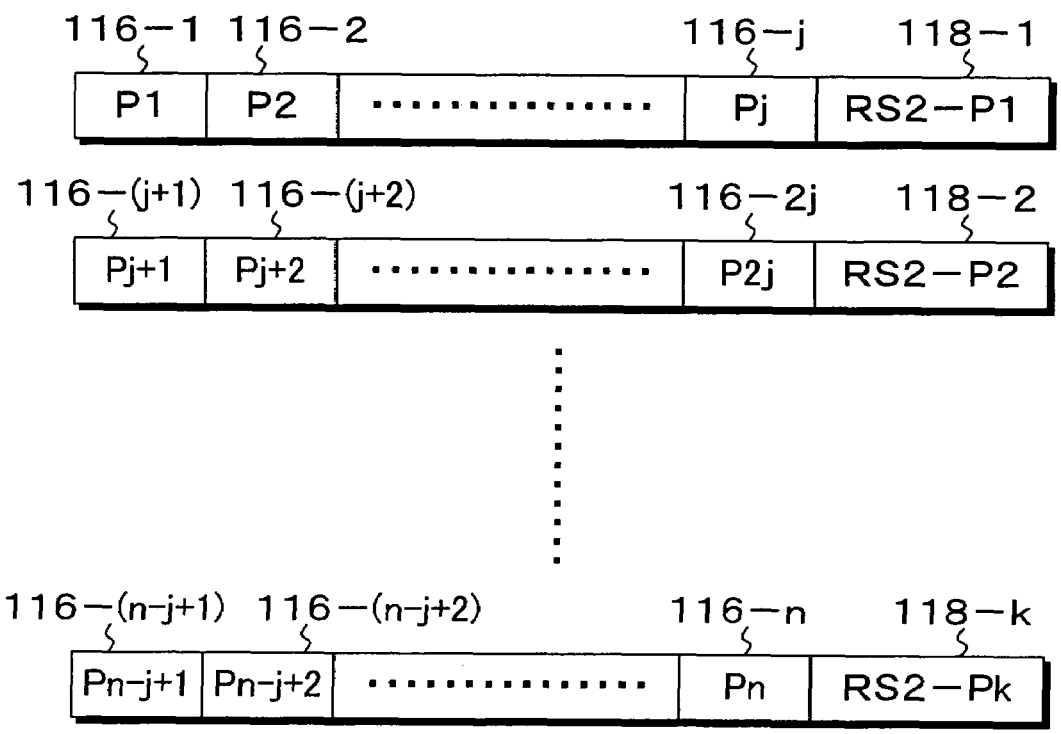
FIG. 5 is an explanatory diagram of an interleave configuration in the encoding process of the present embodiment.

This specific Reed Solomon encoding performed by the second encoding unit 90 can be expressed as "Reed Solomon encoding of $GF(2^7)$, t=28". In this specific example, the information length is 70 symbols, the parity is 56 symbols, and the total is 126 symbols. As shown in FIG. 4E, the code length (126 symbols) in which the generated second RS parity 118 is disposed at the top of the sequence of the Hamming parities 116-1 to 116-n equals to the maximum code length (126 symbols) of the Reed Solomon code of "$GF(2^7)$". On the other hand, if the code length in which the generated second RS parity 118 is disposed at the top of the sequence of the Hamming parities 116-1 to 116-n in the manner shown in FIG. 4E exceeds the maximum code length of the Reed Solomon code of "$GF(2^7)$", as shown in FIG. 5, the Hamming parities 116-1 to 116-n are divided into, for example, k pieces of data, and each piece of the divided data is subjected to Reed Solomon encoding of "$GF(2^7)$" to generate it. Referring again to FIGS. 4A to 4F, the output unit 94 finally disposes the first RS parity 112 generated by the first encoding unit 88 and the second RS parity 118 generated by the third encoding unit 92 at the top of the sector data 110 as shown in FIG. 4F and outputs it as encoded data (code word). In the present embodiment, the Hamming parities 116-1 to 116-n obtained in the Cyclic Hamming encoding are not added to the sector data 110 and output, but they are output as the second RS parity 118 which is obtained by further subjecting the Hamming parities 116-1 to 116-n to Reed Solomon encoding; therefore, redundant bits can be reduced, and the code rate by the ECC encoder can be improved.

Figure 6A:
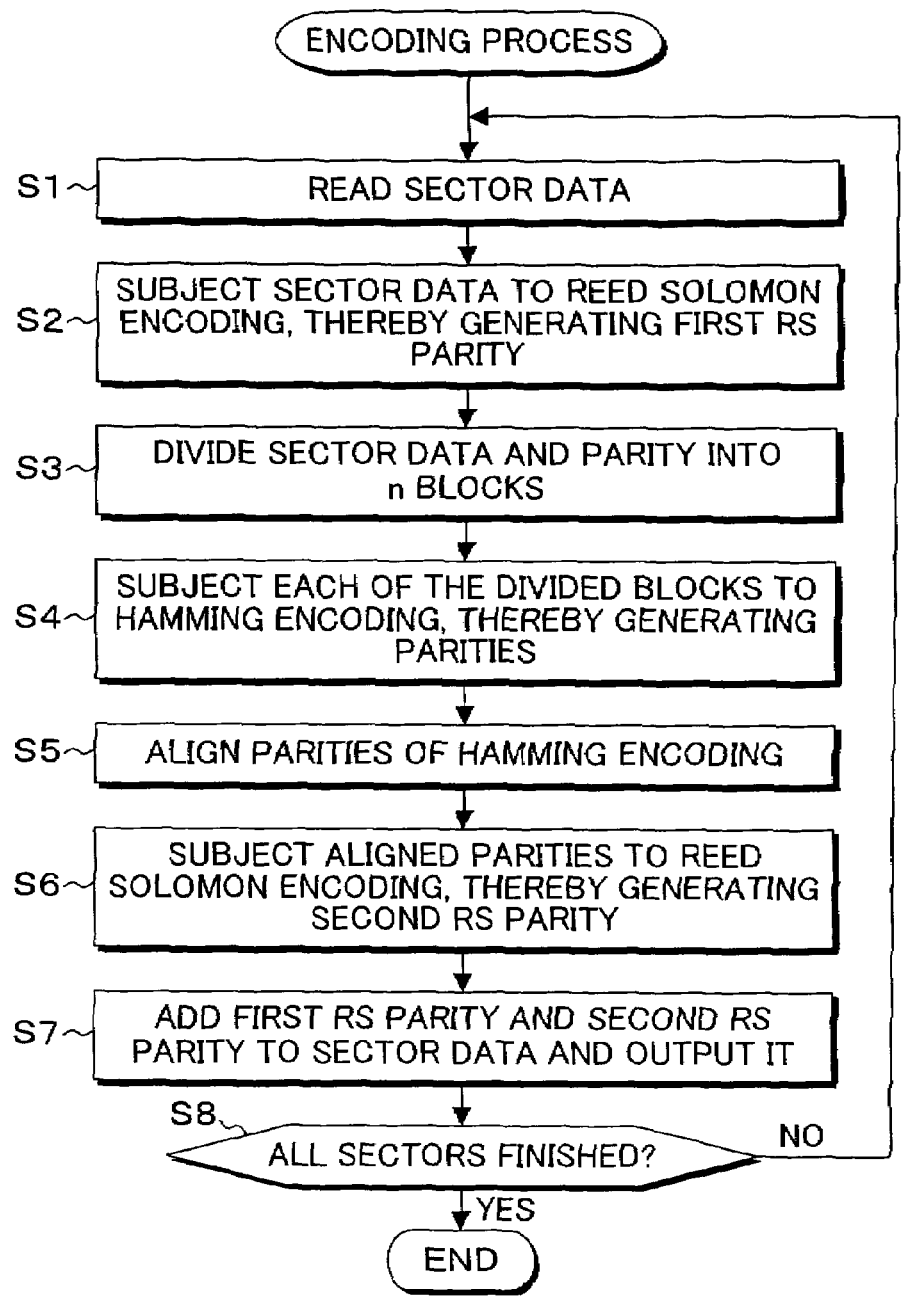
FIGS. 6A and 6B are flow charts of the encoding process by the ECC encoder of FIGS. 4A to 4F.
Figure 6B:
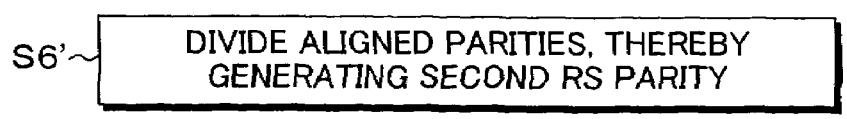

FIGS. 6A and 6B are flow charts of the encoding process performed by the ECC encoder 50 of FIGS. 4A to 4F. In FIGS. 6A and 6B, in the encoding process, the input unit 86 reads the sector data in step S1, and the first encoding unit 88 subjects the sector data to Reed Solomon encoding to generate the first RS parity in step S2. Subsequently, the second encoding unit 90 divides the sector data and the first RS parity into the n pieces of blocks in step S3, and generates the Hamming parities by subjecting each of the divided blocks to cyclic Hamming encoding in step S4. Then, the third encoding unit 92 aligns the Hamming parities obtained in the Hamming encoding in a row in step S5, and then, generates the second RS parity by subjecting the aligned parities to Reed Solomon encoding in step S6. Subsequently, in step S7, the output unit 96 adds the first RS parity and the second RS parity to the sector data and outputs it as encoded data. The processes of steps S1 to S7 are repeated until all sectors of the read data are finished in step S8. If the aligned parities and the second RS parity exceed the maximum code length of the second RS, step S6' is executed instead of step S6.

Figure 7:
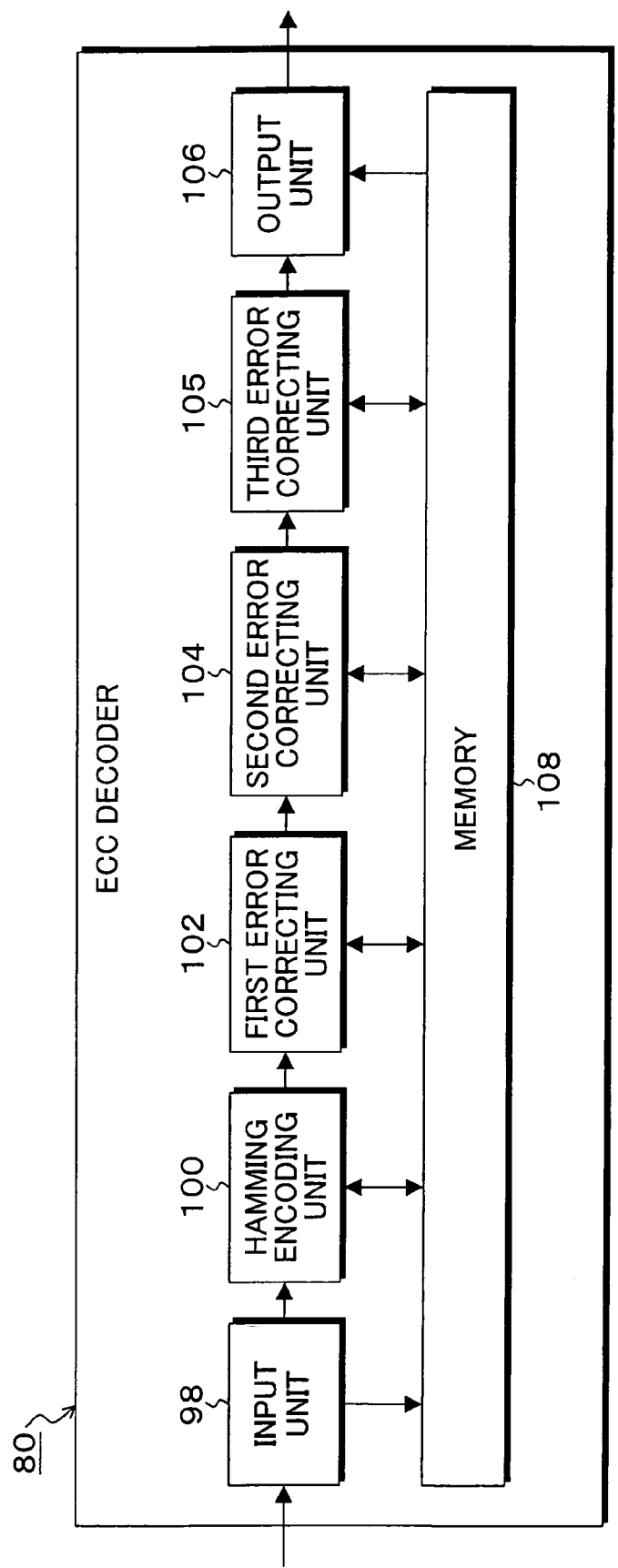
FIG. 7 is a block diagram of a functional configuration of the ECC decoder of FIGS. 2A and 2B.

FIG. 7 is a block diagram showing a functional configuration of the embodiment showing details of the ECC decoder 80 of FIGS. 2A and 2B. In FIG. 7, the ECC decoder 80 comprises an input unit 98, a Hamming encoding unit 100, a first error correcting unit 102, a second error correcting unit 104, a third error correcting unit 105, and an output unit 106. The input unit 98 inputs the encoded data which is read from the magnetic disk and output from the read channel, that is, the encoded data in which the first RS parity and the second RS parity are adjacently connected at the top of the sector data, and saves it in a memory 108. The Hamming encoding unit 100 divides the data, in which the first RS parity is adjacently connected to the sector data, into n pieces of blocks and performs cyclic Hamming encoding in each of the blocks so as to generate Hamming parities. The first error correcting unit 102 subjects the data, in which the Hamming parities generated by the Hamming encoding unit 100 are aligned in a row, to Reed Solomon decoding together with the second RS parity, and, if errors are present in the Hamming parities of the blocks, corrects the errors in the Hamming parities. The second error correcting unit 104 corrects 1 bit errors present in the blocks by performing cyclic Hamming decoding for each of the blocks which have undergone error correction for the Hamming parities. The third error correcting unit 105 aligns the blocks of which 1 bit errors have been corrected and subjects them to Reed Solomon decoding together with the first RS parity so as to correct errors other than those of 1 bit present in the blocks, that is, errors of two or more bits. The output unit 106 outputs the sector data which has undergone error correction as read data.

FIGS. 8A to 8J are explanatory diagrams showing details of the decoding process performed by the ECC decoder of FIG. 7. The encoded data shown in FIG. 8A which is read from the magnetic disk and demodulated is input by the input unit 98 and saved in the memory 108. The encoded data comprises the sector data 110, the first RS parity 112, and the second RS parity 118. The Hamming encoding unit 100 divides the sector data 110 and the first RS parity 112 of the input encoded data into n pieces of blocks 120-1 to 120-n as shown in FIG. 8B. Herein, as an example, a case in which a 1-bit error 124 is present in the block 120-1 and a 2-bit error consisting of two 1-bit errors 126 and 128 is present in the block 120-2 is supposed. The Hamming encoding unit 100 subjects the n-divided blocks 120-1 to 120-n to cyclic Hamming encoding as shown in FIG. 8C and respectively disposes the generated Hamming parities 122-1 to 122-n as shown in FIG. 8C. The Hamming parities 122-1 to 122-n obtained thorough the cyclic Hamming encoding are equal to the Hamming parities 116-1 to 116-n (FIGS. 4A to 4F) calculated in the ECC encoder 50 side as shown in FIG. 8C if there is no bit error in the blocks 120-1 to 120-n. However, if there are the error bits 124, 126, and 128 like the blocks 120-1 and 120-2, bit sequences different from the Hamming parities 116-1 and 116-2 of the corresponding blocks 114-1 and 114-2 calculated in the ECC encoder 50 side of FIG. 4A are output as the Hamming parities 122-1 and 122-2 calculated in the ECC decoder 80 side, and they becomes erroneous parities 130 and 132. Therefore, the first error correcting unit 102 aligns the Hamming parities 122-1 to 122-n including the erroneous parities 130 and 132 generated through the cyclic Hamming encoding in a row like FIG. 8D and subjects them to Reed Solomon decoding of "GF($2^7$)" together with the second RS parity 118. If the total number of the parity errors does not exceed the corrected symbol number t2 of Reed Solomon encoding in the Reed Solomon decoding, the erroneous parities 130 and 132 are corrected to correct parities as shown in FIG. 8E. Then, after the second error correcting unit 104 performs restructuring of respectively disposing the corrected Hamming parities 122-1 to 122-n to the blocks 120-1 to 120-n as shown in FIG. 8F, 1-bit errors present in the blocks 120-1 to 120-n are corrected by cyclic Hamming decoding as shown in FIG. 8G. The 1-bit error 124 present in the block 120-1 is corrected by the cyclic Hamming decoding. However, decoding of the two-bit error consisting of the two 1-bit errors 126 and 128 present in the block 120-2 fails. In LDPC decoding in the LDPC decoder 74 shown in the read channel 42 of FIGS. 2A and 2B in the present embodiment, 1-bit errors are vast majority. Therefore, in order to prevent failure of decoding of the frequently-occurred 1-bit errors in LDPC decoding, satisfactorily increasing the value of the number t2 of corrected symbols of Reed Solomon decoding of the second RS parity 118 is important in the present embodiment. In the present embodiment, as mentioned with the above described ECC encoder 50, the number t2 of corrected symbols of the Reed Solomon code for performing 1-bit error correction is t2=28 symbols. Then, the third error correcting unit 105 aligns the blocks 120-1 to 120-n which have undergone 1-bit error correction as shown in FIG. 8H, and subjects them to Reed Solomon decoding of "GF($2^{10}$)" together with the first RS parity 112 so as to correct errors of two or more bits. The two-bit error consisting of 1-bit errors 126 and 128 remaining in the block 120-2 is corrected by the Reed Solomon decoding. Herein, in the LDPC code, 1-bit errors are vast majority, and errors of two or more bits does not frequently occur, therefore, the number t1 of corrected symbols which is the correction ability of the first RS parity 112 is not required to be large. In the present embodiment, as is shown for the ECC encoder 50, the number t1 of corrected symbols of the Reed Solomon code in this case is suppressed to t1=4 symbols. Finally, the output unit 106 outputs the sector data 110 of which 1-bit errors and 2-bit errors contained in the input encoded data have been corrected is output from the ECC decoder 80 as shown FIG. 8I.

FIGS. 9A to 9I are explanatory diagrams of a decoding process for the encoded data which is accompanied by an interleave configuration of FIG. 5. In the encoded data which is accompanied by the interleave configuration, as shown in the ECC decoder input of FIG. 9A, in addition to the first RS parity 112, for example, two second RS parities 118-1 and 118-2 are added in the front side of the sector data 110. Therefore, the points that, after the data including the sector data 110 and the first RS parity 112 which is adjacently connected thereto is divided into the blocks 120-1 to 120-n by n division as shown in FIG. 9B, each of the blocks 120-1 to 120-n is subjected to cyclic Hamming decoding so as to generate the Hamming parities 122-1 to 122-n as shown in FIG. 9C are same as FIGS. 8A to 8J. However, in the next Reed Solomon decoding using the second RS parity 118, the Hamming parities 122-1 to 122-n obtained in the Hamming decoding are divided into two, that is, into Hamming parities 122-1 to 122-j of FIG. 9D and Hamming parities 122-j+1 to 122-n of FIG. 9F, and they are respectively combined with the second RS parities 118-1 and 118-2 and subjected to second RS decoding as shown in FIG. 9E and FIG. 9G so as to correct errors of the Hamming parities. It is same as the case of FIGS. 8A to 8J in the points of restructuring of FIG. 9H in which the error-corrected Hamming parities thereafter are added to the blocks 120-1 to 120-n to the 1-bit error correction of FIG. 9I by Hamming decoding and, furthermore, that error correction of 2 or more bits are performed together with the first RS parity 112 in FIG. 9J to FIG. 9L so as to output them.

FIGS. 10A and 10B are flow charts of the decoding process performed by the ECC decoder of FIG. 7. If there is one second RS parity, in the decoding process of FIGS. 10A and 10B, the input unit 98 reads the decoded data (after decoding) in which the first RS parity is added to the sector data in step S1, the sector data and the first RS parity is divided into n pieces of blocks in step S2, and each of the divided blocks is subjected to cyclic Hamming encoding so as to generate Hamming parities in step S3. Then, the Hamming parities are aligned and subjected to Reed Solomon decoding together with the second RS parity so as to correct the parities. Subsequently, in step S5, the corrected parities are combined with the respective blocks, and 1-bit errors in the blocks are corrected by cyclic Hamming decoding. Furthermore, in step S8, the blocks of which 1-bit errors have been corrected are aligned, and they are subjected to Reed Solomon decoding together with the first RS parity so as to perform correction of two or more bits. Such processes of steps S1 to S6 are repeated until the processes of all the sectors to be read is finished in step S7. Meanwhile, if there are a plurality of second RS parities, instead of step S4, step S4' is performed, wherein, after the Hamming parities are aligned, they are divided into a plurality of blocks corresponding to the number of second RS parities, and they are subjected to Reed Solomon decoding together with the second RS parities corresponding to the blocks so as to correct the parities. Herein, the error correction process performed by the ECC encoder 50 and the ECC decoder 80 of the present embodiment are compared with a conventional error correction process performed merely by the Reed Solomon code below. First of all, if sector data of one sector is 4100 bits and redundant bits added thereto are 480 bits as error correction by means of the conventional Reed Solomon code, errors of up to 24 symbols can be corrected by conventional Reed Solomon code wherein 1 symbol=10 bits. On the other hand, in the present embodiment, when the symbol length of the Reed Solomon code of FIG. 4B q1=10 bits and the number of corrected symbols t1=4 bits, and, furthermore, when the symbol length of the Reed Solomon code of FIG. 4E q2=7 bits and the number of corrected symbols t2=28 bits, the parity length consisting of the first RS parity 112 and the second RS parity 118 in the encoded data of FIG. 4F is 472 bits, and 1-bit errors corresponding to 28 bits can be corrected in spite of short parity length. Therefore, as long as the parity length is about the same as the Reed Solomon code, the correction number of 1-bit errors according to the present embodiment can be sufficiently increased compared with the case of merely the Reed Solomon code, and error correction of data obtained in decoding of the LDPC code in which 1-bit errors are predominant can be reliably and efficiently performed. The present invention also provides an encoding program and a decoding program executed by the ECC encoder 50 and the ECC decoder 80 shown in FIG. 3 and FIG. 7, and the contents of the programs are the contents shown in the flow charts of FIG. 6A, FIG. 6B, FIG. 10A and FIG. 10B. The hard disk controller 40 of FIGS. 2A and 2B having the functions of the ECC encoder 50 and the ECC decoder 80 of the present embodiment is realized by a built-in-type computer having a hardware configuration having a CPU, a memory, input/output interfaces. When the encoding program and the decoding program of the present embodiment are stored in a non-volatile memory of the computer and executed by the CPU, the functions of the ECC encoder 50 and the ECC decoder 80 can be realized. The present embodiment employs, as an example, error correction in recording/reproducing systems of a magnetic disk apparatus; however, the present invention is not limited thereto and can be similarly applied to sequences using LDPC codes where 1-bit errors frequently occur, for example, to storage devices such as optical disks and communication devices. In the ECC encoder 50 and the ECC decoder of FIG. 3 and FIG. 7, the input sector data and input code are once saved in the memories, and then, subjected to the encoding process and the decoding process; however, a so-called on-the-fly processing configuration for performing encoding and decoding while transferring data to respective units without using memories may be employed. The present invention is not limited to the above described embodiments, includes arbitrary modifications that do not impair the object and advantages thereof, and is not limited by the numerical values shown in the above described embodiments.

What is claimed is:

1. An error correction device having an encoder and a decoder for correcting errors in data which is to be transmitted in a recording/reproducing system including a 1-bit-error-dominant recording medium, the error correction device characterized in that the encoder has
an input unit that inputs unit length data to be recorded to the recording medium,
a first encoding unit that subjects the unit length data to Reed Solomon encoding so as to generate a first RS parity,
a second encoding unit that divides the data in which the first RS parity is adjacently connected to the unit length data into a predetermined number n of blocks and subjecting each of the blocks to cyclic Hamming encoding so as to generate Hamming parities,
a third encoding unit that subjects data in which the Hamming parities are aligned in a row to Reed Solomon encoding so as to generate a second RS parity, and
an output unit that outputs encoded data in which the first RS parity and the second RS parity are adjacently connected to the unit length data; and the decoder has
an input unit that inputs the encoded data which is read from the recording medium and in which the first RS parity and the second RS parity are adjacently connected to the unit length data,
a Hamming encoding unit that divides the data in which the first RS parity is adjacently connected to the unit length data into the predetermined number n of blocks and subjecting each of the blocks to cyclic Hamming encoding so as to generate Hamming parities,
a first error correcting unit that subjects the data in which the Hamming parities are aligned in a row to Reed Solomon decoding together with the second RS parity so as to correct an error in the Hamming parities of the blocks,
a second error correcting unit that subjects each of the blocks to cyclic Hamming decoding together with the error-corrected Hamming parity so as to correct a 1-bit error in the blocks,
a third error correcting unit that subjects the data in which the 1-bit-error-corrected blocks are aligned to Reed Solomon decoding together with the first RS parity so as to correct an error in the blocks other than that of 1-bit, and an output unit that outputs the error-corrected unit length data.

2. The error correction device according to claim 1, characterized in that,
if the data in which the Hamming parities are aligned in a row exceeds a maximum code length of a Reed Solomon code, the third encoding unit of the encoder divides the data into a plurality of pieces of data and subjects each of the divided pieces of the data to Reed Solomon encoding so as to generate a plurality of second RS parities;
the output unit of the encoder outputs encoded data in which the first RS parity and the plurality of second RS parities are adjacently connected to the unit length data;

and, if the plurality of second RS parities are adjacently connected to the unit data, the first error correcting unit of the decoder divides the data, in which the Hamming parities are aligned in a row, corresponding to the plurality of second RS parities and subjects each of the divided pieces of data to Reed Solomon decoding together with the corresponding second RS parity so as to correct an error in the Hamming parities of the blocks.

3. An encoder for performing encoding for error correction of data which is to be transmitted in a recording/reproducing system including a 1-bit-error-dominant recording medium, the encoder characterized by having an input unit that inputs unit length data to be recorded to the recording medium, a first encoding unit that subjects the unit length data to Reed Solomon encoding so as to generate a first RS parity, a second encoding unit that divides the data in which the first RS parity is adjacently connected to the unit length data into a predetermined number n of blocks and subjecting each of the blocks to Hamming encoding so as to generate Hamming parities, a third encoding unit that subjects data in which the Hamming parities are aligned in a row to Reed Solomon encoding so as to generate a second RS parity, and an output unit that outputs encoded data in which the first RS parity and the second RS parity are adjacently connected to the unit length data.

4. The encoder according to claim 3, characterized in that, if the data in which the Hamming parities are aligned in a row exceeds a maximum code length of a Reed Solomon code, the third encoding unit divides the data into a plurality of pieces of data and subjects each of the divided pieces of the data to Reed Solomon encoding so as to generate a plurality of second RS parities; and the output unit outputs encoded data in which the first RS parity and the plurality of second RS parities are adjacently connected to the unit length data.

5. A decoder for decoding encoded data encoded for error correction of data which is to be transmitted in a recording/reproducing system including a 1-bit-error-dominant recording medium, the decoder characterized by having an input unit that inputs the encoded data which is read from the recording medium and in which the first RS parity and the second RS parity are adjacently connected to the unit length data, a Hamming encoding unit that divides the data in which the first RS parity is adjacently connected to the unit length data into the predetermined number n of blocks and subjecting each of the blocks to Hamming encoding so as to generate Hamming parities, a first error correcting unit that subjects the data in which the Hamming parities are aligned in a row to Reed Solomon decoding together with the second RS parity so as to correct an error in the Hamming parities of the blocks, a second error correcting unit that subjects each of the blocks to cyclic Hamming decoding together with the error-corrected Hamming parity so as to correct a 1-bit error in the blocks, a third error correcting unit that subjects the data in which the 1-bit-error-corrected blocks are aligned to Reed Solomon decoding together with the first RS parity so as to correct an error in the blocks other than that of 1-bit, and an output unit that outputs the error-corrected unit length data.

6. The decoder according to claim 5, characterized in that, if the plurality of second RS parities are adjacently connected to the unit data, the first error correcting unit divides the data, in which the Hamming parities are aligned in a row, corresponding to the plurality of second RS parities and subjects each of the divided pieces of data to Reed Solomon decoding together with the corresponding second RS parity so as to correct an error in the Hamming parities of the blocks.

7. An error correction device having an encoder and a decoder for correcting errors in data which is to be transmitted in an m-bit-error-dominant sequence, the error correction device characterized in that the encoder has an input unit that inputs unit length data, a first encoding unit that subjects the unit length data to Reed Solomon encoding so as to generate a first RS parity, a second encoding unit that divides the data in which the first RS parity is adjacently connected to the unit length data into a predetermined number n of blocks and generating an m-bit correcting parity for each of the blocks by an m-bit error correcting code, a third encoding unit that subjects the data in which the m-bit correcting parities are aligned in a row to Reed Solomon encoding so as to generate a second RS parity, and an output unit that outputs encoded data in which the first RS parity and the second RS parity are adjacently connected to the unit length data; and the decoder has an input unit that inputs the encoded data in which the first RS parity and the second RS parity are adjacently connected to the unit length data, an m-bit correcting encoding unit that divides the data in which the first RS parity is adjacently connected to the unit length data into the predetermined number n of blocks and generating an m-bit correcting parity for each of the blocks by an m-bit error correcting code, a first error correcting unit that subjects the data in which the m-bit correcting parities are aligned in a row to Reed Solomon decoding together with the second RS parity so as to correct an error in the m-bit correcting parities of the blocks, a second error correcting unit that subjects each of the blocks to decoding together with the error-corrected m-bit correcting parity so as to correct an m-bit error in each of the blocks, a third error correcting unit that subjects the data in which the m-bit-error-corrected blocks are aligned to Reed Solomon decoding together with the first RS parity so as to correct an error in the blocks other than that of m-bit, and an output unit that outputs the error-corrected unit length data.

8. An error correction method having an encoding step and a decoding step for correcting errors in data which is to be transmitted in a recording/reproducing system including a 1-bit-error-dominant recording medium, the error correction method characterized in that the encoding step includes an input step of inputting unit length data to be recorded to the recording medium, a first encoding step of subjecting the unit length data to Reed Solomon encoding so as to generate a first RS parity, a second encoding step of dividing the data in which the first RS parity is adjacently connected to the unit length data into a predetermined number n of blocks and subjecting each of the blocks to Hamming encoding so as to generate Hamming parities, a third encoding step of subjecting the data in which the Hamming parities are aligned in a row to Reed Solomon encoding so as to generate a second RS parity, and an output step of outputting encoded data in which the first RS parity and the second RS parity are adjacently connected to the unit length data; and the decoding step includes an input step of inputting the encoded data which is read from the recording medium and in which the first RS parity and the second RS parity are adjacently connected to the unit length data, a Hamming encoding step of dividing the data in which the first RS parity is adjacently connected to the unit length data into the predetermined number n of blocks and subjecting each of the blocks to Hamming encoding so as to generate Hamming parities, a first error correcting step of subjecting the data in which the Hamming parities are aligned in a row to Reed Solomon decoding together with the second RS parity so as to correct an error in the Hamming parities of the blocks, a second error correcting step of subjecting each of the blocks to cyclic Hamming decoding together with the error-corrected Hamming parity so as to correct a 1-bit error in the blocks, a third error correcting step of subjecting the data in which the 1-bit-error-corrected blocks are aligned to Reed Solomon decoding together with the first RS parity so as to correct an error in the blocks other than that of 1-bit, and an output step of outputting the error-corrected unit length data.

9. The error correction method according to claim 8, characterized in that, if the data in which the Hamming parities are aligned in a row exceeds a maximum code length of a Reed Solomon code, in the third encoding step of the encoding step, the data is divided into a plurality of pieces of data, and each of the divided pieces of the data is subjected to Reed Solomon encoding so as to generate a plurality of second RS parities;

in the output step of the encoding step, encoded data in which the first RS parity and the plurality of second RS parities are adjacently connected to the unit length data is output; and, if the plurality of second RS parities are adjacently connected to the unit data, in the first error correcting step of the decoding step, the data in which the Hamming parities are aligned in a row is divided corresponding to the plurality of second RS parities, and each of the divided pieces of data is subjected to Reed Solomon decoding together with the corresponding second RS parity so as to correct an error in the Hamming parities of the blocks.

10. An encoding method of performing encoding for correcting errors of data which is to be transmitted in a recording/reproducing system including a 1-bit-error-dominant recording medium, the encoding method characterized by having an input step of inputting unit length data to be recorded to the recording medium, a first encoding step of subjecting the unit length data to Reed Solomon encoding so as to generate a first RS parity, a second encoding step of dividing the data in which the first RS parity is adjacently connected to the unit length data into a predetermined number n of blocks and subjecting each of the blocks to Hamming encoding so as to generate Hamming parities, a third encoding step of subjecting the data in which the Hamming parities are aligned in a row to Reed Solomon encoding so as to generate a second RS parity, and an output step of outputting encoded data in which the first RS parity and the second RS parity are adjacently connected to the unit length data.

11. The encoding method according to claim 10, characterized in that, if the data in which the Hamming parities are aligned in a row exceeds a maximum code length of a Reed Solomon code, in the third encoding step, the data is divided into a plurality of pieces of data and each of the divided pieces of the data is subjected to Reed Solomon encoding so as to generate a plurality of second RS parities; and, in the output step, encoded data in which the first RS parity and the plurality of second RS parities are adjacently connected to the unit length data is output.

12. A decoding method of decoding encoded data encoded for correcting errors of data which is to be transmitted in a recording/reproducing system including a 1-bit-error-dominant recording medium, the decoding method characterized by including an input step of inputting the encoded data which is read from the recording medium and in which the first RS parity and the second RS parity are adjacently connected to the unit length data, a Hamming encoding step of dividing the data in which the first RS parity is adjacently connected to the unit length data into the predetermined number n of blocks and subjecting each of the blocks to Hamming encoding so as to generate Hamming parities, a first error correcting step of subjecting the data in which the Hamming parities are aligned in a row to Reed Solomon decoding together with the second RS parity so as to correct an error in the Hamming parities of the blocks, a second error correcting step of subjecting each of the blocks to cyclic Hamming decoding together with the error-corrected Hamming parity so as to correct a 1-bit error in the blocks, a third error correcting step of subjecting the data in which the 1-bit-error-corrected blocks are aligned to Reed Solomon decoding together with the first RS parity so as to correct an error in the blocks other than that of 1-bit, and an output step of outputting the error-corrected unit length data.

13. The decoding method according to claim 12, characterized in that, if the plurality of second RS parities are adjacently connected to the unit data, in the first error correcting step, the data in which the Hamming parities are aligned in a row is divided corresponding to the plurality of second RS parities, and each of the divided pieces of data is subjected to Reed Solomon decoding together with the corresponding second RS parity so as to correct an error in the Hamming parities of the blocks.

14. An error correction method including an encoding step and a decoding step for correcting errors in data which is to be transmitted in an m-bit-error-dominant sequence, the error correction method characterized in that the encoding step includes
an input step of inputting unit length data,
- a first encoding step of subjecting the unit length data to Reed Solomon encoding so as to generate a first RS parity,
- a second encoding step of dividing the data in which the first RS parity is adjacently connected to the unit length data into a predetermined number n of blocks and generating an m-bit correcting parity for each of the blocks by an m-bit error correcting code,
- a third encoding step of subjecting the data in which the m-bit correcting parities are aligned in a row to Reed Solomon encoding so as to generate a second RS parity, and
- an output step of outputting encoded data in which the first RS parity and the second RS parity are adjacently connected to the unit length data; and the decoding step includes
an input step of inputting the encoded data in which the first RS parity and the second RS parity are adjacently connected to the unit length data,
an m-bit correcting encoding step of dividing the data in which the first RS parity is adjacently connected to the unit length data into the predetermined number n of blocks and generating an m-bit correcting parity for each of the blocks by an m-bit error correcting code,
- a first error correcting step of subjecting the data in which the m-bit correcting parities are aligned in a row to Reed Solomon decoding together with the second RS parity so as to correct an error in the m-bit correcting parities of the blocks,
- a second error correcting step of subjecting each of the blocks to decoding together with the error-corrected m-bit correcting parity so as to correct an m-bit error in the blocks,
- a third error correcting step of subjecting the data in which the m-bit-error-corrected blocks are aligned to Reed Solomon decoding together with the first RS parity so as to correct an error in the blocks other than that of m-bit, and
an output step of outputting the error-corrected unit length data.

15. An information storage device having a recording/reproducing system including a 1-bit-error-dominant recording medium and an error correction device having an encoder and a decoder for correcting errors in data which is to be transmitted in the recording/reproducing system, the information storage device characterized in that the encoder has
an input unit that inputs unit length data to be recorded to the recording medium,
a first encoding unit that subjects the unit length data to Reed Solomon encoding so as to generate a first RS parity,
a second encoding unit that divides the data in which the first RS parity is adjacently connected to the unit length data into a predetermined number n of blocks and subjecting each of the blocks to cyclic Hamming encoding so as to generate Hamming parities,
a third encoding unit that subjects the data in which the Hamming parities are aligned in a row to Reed Solomon encoding so as to generate a second RS parity, and
an output unit that outputs encoded data in which the first RS parity and the second RS parity are adjacently connected to the unit length data; and the decoder has
an input unit that inputs the encoded data which is read from the recording medium and in which the first RS parity and the second RS parity are adjacently connected to the unit length data, a Hamming encoding unit that divides the data in which the first RS parity is adjacently connected to the unit length data into the predetermined number n of blocks and subjecting each of the blocks to cyclic Hamming encoding so as to generate Hamming parities,
a first error correcting unit that subjects the data in which the Hamming parities are aligned in a row to Reed Solomon decoding together with the second RS parity so as to correct an error in the Hamming parities of the blocks,
a second error correcting unit that subjects each of the blocks to cyclic Hamming decoding together with the error-corrected Hamming parity so as to correct a 1-bit error in the blocks,
a third error correcting unit that subjects the data in which the 1-bit-error-corrected blocks are aligned to Reed Solomon decoding together with the first RS parity so as to correct an error in the blocks other than that of 1-bit, and
an output unit that outputs the error-corrected unit length data.

16. The information storage device according to claim 15, characterized in that,
if the data in which the Hamming parities are aligned in a row exceeds a maximum code length of a Reed Solomon code, the third encoding unit of the encoder divides the data into a plurality of pieces of data and subjects each of the divided pieces of the data to Reed Solomon encoding so as to generate a plurality of second RS parities;
the output unit of the encoder outputs encoded data in which the first RS parity and the plurality of second RS parities are adjacently connected to the unit length data; and,
if the plurality of second RS parities are adjacently connected to the unit data, the first error correcting unit of the decoder divides the data, in which the Hamming parities are aligned in a row, corresponding to the plurality of second RS parities and subjects each of the divided pieces of data to Reed Solomon decoding together with the corresponding second RS parity so as to correct an error in the Hamming parities of the blocks.

17. An information storage device having an m-bit-error-dominant sequence and an encoder and a decoder for correcting errors in data which is to be transmitted in the systems, the information storage device characterized in that the encoder has
an input unit that inputs unit length data,
a first encoding unit that subjects the unit length data to Reed Solomon encoding so as to generate a first RS parity,
a second encoding unit divides the data in which the first RS parity is adjacently connected to the unit length data into a predetermined number n of blocks and generating an m-bit correcting parity for each of the blocks by an m-bit error correcting code,
a third encoding unit that subjects data in which the m-bit correcting parities are aligned in a row to Reed Solomon encoding so as to generate a second RS parity, and
an output unit that outputs encoded data in which the first RS parity and the second RS parity are adjacently connected to the unit length data; and the decoder has an input unit that inputs the encoded data in which the first RS parity and the second RS parity are adjacently connected to the unit length data, an m-bit correcting encoding unit that divides the data in which the first RS parity is adjacently connected to the unit length data into the predetermined number n of blocks and generating an m-bit correcting parity for each of the blocks by an m-bit error correcting code, a first error correcting unit that subjects the data in which the m-bit correcting parities are aligned in a row to Reed Solomon decoding together with the second RS parity so as to correct an error in the m-bit correcting parities of the blocks, a second error correcting unit that subjects each of the blocks to decoding together with the error-corrected m-bit correcting parity so as to correct an m-bit error in each of the blocks, a third error correcting unit that subjects the data in which the m-bit-error-corrected blocks are aligned to Reed Solomon decoding together with the first RS parity so as to correct an error in the blocks other than that of m-bit, and an output unit that outputs the error-corrected unit length data.

\* \* \* \* \*